US009748122B2

(12) United States Patent
Yoshii et al.

(10) Patent No.: US 9,748,122 B2
(45) Date of Patent: Aug. 29, 2017

(54) THERMAL PROCESSING APPARATUS AND METHOD OF CONTROLLING THE SAME

(71) Applicant: Tokyo Electron Limited, Tokyo (JP)

(72) Inventors: Koji Yoshii, Oshu (JP); Tatsuya Yamaguchi, Sapporo (JP); Wenling Wang, Oshu (JP); Takanori Saito, Oshu (JP)

(73) Assignee: Tokyo Electron Limited, Minato-Ku (JP)

( * ) Notice: Subject to any disclaimer, the term of this patent is extended or adjusted under 35 U.S.C. 154(b) by 781 days.

(21) Appl. No.: 14/270,524

(22) Filed: May 6, 2014

(65) Prior Publication Data

US 2014/0238972 A1  Aug. 28, 2014

Related U.S. Application Data

(62) Division of application No. 13/408,223, filed on Feb. 29, 2012, now Pat. No. 8,835,811.

(30) Foreign Application Priority Data

Mar. 1, 2011 (JP) ................................. 2011-044197

(51) Int. Cl.
*F27B 5/14* (2006.01)
*H05B 1/02* (2006.01)
(Continued)

(52) U.S. Cl.
CPC .... *H01L 21/67115* (2013.01); *F27B 17/0025* (2013.01); *F27D 19/00* (2013.01);
(Continued)

(58) Field of Classification Search
CPC .. F27B 17/0025; F27D 19/00; F27D 21/0014; H01L 21/67109; H01L 21/67248
(Continued)

(56) References Cited

U.S. PATENT DOCUMENTS 4,802,441 A  2/1989 Waugh
5,517,594 A  5/1996 Shah et al.
(Continued)

FOREIGN PATENT DOCUMENTS

JP  2002-075890      3/2002
JP  2002-305189 A1  10/2002
(Continued)

OTHER PUBLICATIONS

Japanese Office Action mailed Jun. 10, 2014 (Application No. 2011-044197).

*Primary Examiner* — Tu B Hoang
*Assistant Examiner* — Alba Rosario-Aponte
(74) *Attorney, Agent, or Firm* — Burr & Brown, PLLC (57) ABSTRACT

A control unit can select a large-number control zone model in which the number of control zones, which are independently controlled, is large, and a small-number control zone model in which the number of control zones, which are independently controlled, is small. When a temperature is increased or decreased, the control unit can select the small-number control zone model so as to control, based on signals from temperature sensors of the respective control zones C1 ... C5 whose number is small, heaters located on the respective control zones C1 ... C5. When a temperature is stabilized, the control unit can select the large-number control zone model so as to control, based on signals signals from the temperature sensors of the respective control zones C1 ... C10 whose number is large, the heaters located on the respective control zones C1 ... C10.

10 Claims, 6 Drawing Sheets

(51) Int. Cl.
 *H01L 21/67* (2006.01)
 *F27B 17/00* (2006.01)
 *F27D 19/00* (2006.01)
 *F27D 21/00* (2006.01)

(52) U.S. Cl.
 CPC .... *F27D 21/0014* (2013.01); *H01L 21/67109* (2013.01); *H01L 21/67248* (2013.01)

(58) Field of Classification Search
 USPC ....... 219/390, 490, 494, 509, 398, 410, 413, 219/480, 531
 See application file for complete search history.

(56) References Cited

U.S. PATENT DOCUMENTS 5,846,073 A    12/1998  Weaver
7,432,475 B2   10/2008  Nakajima et al.

FOREIGN PATENT DOCUMENTS

THERMAL PROCESSING APPARATUS AND METHOD OF CONTROLLING THE SAME

CROSS REFERENCE TO RELATED APPLICATION

This application is a division of U.S. application Ser. No. 13/408,223, filed Feb. 29, 2012, and claims the benefit under 35 USC §119(a)-(d) of Japanese Patent Application No. 2011-044197, filed Mar. 1, 2011, the entireties of which are incorporated herein by reference.

FIELD OF THE INVENTION

The present invention relates to a thermal processing apparatus and a method of controlling the same.

BACKGROUND OF THE INVENTION

In the manufacture of semiconductor devices, various thermal processing apparatuses are used for subjecting objects to be processed, such as semiconductor wafers, to thermal processes such as an oxidation process, a diffusion process, a CVD process and an annealing process. As one of such processing apparatuses, there is known a vertical-type thermal processing apparatus capable of thermally processing a number of objects to be processed at once. The vertical-type thermal processing apparatus includes: a quartz processing vessel having a lower opening; a lid member configured to open and close the opening of the processing vessel; a holder disposed on the lid member, the holder being configured to hold a plurality of objects to be processed with equal intervals therebetween in an up and down direction; and a furnace body disposed around the processing vessel, and provided with a heater for heating the objects to be processed loaded into the processing vessel.

In order to precisely control a temperature in the furnace body, the following conventional technique has been developed. Namely, a space in the furnace body is divided into a plurality of control zones, and in-furnace temperature sensors are placed in the respective control zones. In addition, a heater is divided for the respective control zones, whereby temperatures of the respective control zones are finely controlled.

However, when the inside space of the furnace body is divided into the plurality of control zones, and the respective control zones are finely controlled, a problem occurs in that it is difficult to control a temperature when it is increased or decreased so that it takes a lot of time to tune control parameters, although a temperature uniformity can be improved when the temperature is stabilized.
Patent Document 1: JP-2002-305189-A
Patent Document 2: JP-2005-188869-A The present invention has been made in view of the above circumstances. The object of the present invention is to provide a thermal processing apparatus and a method of controlling the same, which are capable of improving a temperature uniformity in a furnace body when a temperature is stabilized, and of easily controlling the temperature in the furnace body when a temperature is increased or decreased.

SUMMARY OF THE INVENTION

A thermal processing apparatus in one embodiment is a thermal processing apparatus comprising: a furnace body; a processing vessel disposed in the furnace body, the processing vessel defining, between the furnace body and the processing vessel, a space including therein a plurality of unit areas, and the processing vessel being configured to accommodate a plurality of objects to be processed; a heating unit disposed on an inner surface of the furnace body, correspondingly to each of the unit areas of the space; an in-furnace temperature sensor disposed correspondingly to each of the unit areas of the space; and a control unit configured to control, based on a signal from the in-furnace temperature sensor of each of the unit areas, the heating unit of the unit area; wherein: the control unit includes a large-number control zone mode in which the number of control zones, which are formed of the unit areas and are independently controlled, is large, and a small-number control zone mode in which the number of control zones, which are formed of the unit areas and are independently controlled, is small; and the control unit is configured to select the small-number control zone mode in which the number of the control zones is small, so as to control the heating units of the respective control zones, when a temperature is increased or decreased, and is configured to select the large-number control zone mode in which the number of the control zones is large, so as to control the heating units of the respective control zones, when a temperature is stabilized.

In the thermal processing apparatus, in the large-number control zone mode, each of the control zones is formed of the one unit area, and the control unit is configured to control, based on a signal from the in-furnace temperature sensor of the one unit area, the heating unit of the unit area; and in the small-number control zone mode, at least the one control zone is formed of the plurality of adjacent unit areas, and the control unit is configured to control, based on a signal from the in-furnace temperature sensor of the desired unit area out of the plurality of the unit areas, the heating units of the plurality of unit areas.

In the thermal processing apparatus, the control unit is configured to control, in the large-number control zone mode, the heating unit in each of the control zones based on a previously incorporated numerical model for large-number control zones, and is configured to control, in the small-number control zone mode, the heating unit in each of the control zones based on a previously incorporated numerical model for small-number control zones.

In the thermal processing apparatus, a blower is connected to the furnace body through a cooling-medium supply line, the blower being configured to supply a cooling medium to the space between the furnace body and the processing vessel, and the furnace body is provided with an exhaust pipe; and the control unit is configured to control, based on a signal from the in-furnace temperature sensor of each of the unit areas, the heating unit of the unit area and the blower.

In the thermal processing apparatus, the control unit is configured to select the small-number control zone mode so as to control the heating unit of each of the control zones and the blower, when a temperature is increased or decreased.

A thermal processing apparatus in another embodiment is a thermal processing apparatus comprising: a furnace body: a processing vessel disposed in the furnace body, the processing vessel defining, between the furnace body and the processing vessel, a space including therein a plurality of unit areas, and the processing vessel being configured to accommodate a plurality of objects to be processed; a heating unit disposed on an inner surface of the furnace body, correspondingly to each of the unit areas of the space; an in-processing-vessel temperature sensor disposed correspondingly to each of the unit areas in the processing vessel;

and a control unit configured to control, based on a signal from the in-processing-vessel temperature sensor of each of the unit areas, the heating unit of the unit area; wherein:

the control unit includes a large-number control zone mode in which the number of control zones, which are formed of the unit areas and are independently controlled, is large, and a small-number control zone mode in which the number of control zones, is small; and the control unit is configured to select the small-number control zone mode in which the number of the control zones is small, so as to control the heating units of the respective control zones, when a temperature is increased or decreased, and is configured to select the large-number control zone mode in which the number of the control zones is large, so as to control the heating units of the respective control zones, when a temperature is stabilized.

In the thermal processing apparatus, in the large-number control zone mode, each of the control zones is formed of the one unit area, and the control unit is configured to control, based on a signal from the in-processing-vessel temperature sensor of the one unit area, the heating unit of the unit area; and in the small-number control zone mode, at least the one control zone is formed of the plurality of the adjacent unit areas, and the control unit is configured to control, based on a signal from the in-processing-vessel temperature sensor of the desired unit area out of the plurality of the unit areas, the heating units of the plurality of unit areas.

In the thermal processing apparatus, the control unit is configured to control, in the large-number control zone mode, the heating unit in each of the control zones based on a previously incorporated numerical model for large-number control zones, and is configured to control, in the small-number control zone mode, the heating unit in each of the control zones based on a previously incorporated numerical model for small-number control zones.

In the thermal processing apparatus, a blower is connected to the furnace body through a cooling-medium supply line, the blower being configured to supply a cooling medium to the space between the furnace body and the processing vessel, and the furnace body is provided with an exhaust pipe; and the control unit is configured to control, based on a signal from the in-processing-vessel temperature sensor of each of the unit areas, the heating unit of the unit area and the blower.

In the thermal processing apparatus, the control unit is configured to select the small-number control zone mode so as to control the heating unit of each of the control zones and the blower, when a temperature is increased or decreased.

A method of controlling a thermal processing apparatus in one embodiment is a method of controlling a thermal processing apparatus comprising: a furnace body; a processing vessel disposed in the furnace body, the processing vessel defining, between the furnace body and the processing vessel, a space including therein a plurality of unit areas, and the processing vessel being configured to accommodate a plurality of objects to be processed; a heating unit disposed on an inner surface of the furnace body, correspondingly to each of the unit areas of the space; an in-furnace temperature sensors disposed correspondingly to each of the unit areas of the space; and a control unit configured to control, based on a signal from the in-furnace temperature sensor of each of the unit areas, the heating unit of the unit area; wherein the control unit includes a large-number control zone mode in which the number of control zones, which are formed of the unit areas and are independently controlled, is large, and a small-number control zone mode in which the number of control zones, which are formed of the unit areas and are independently controlled, is small; the method of controlling the thermal processing apparatus comprising: selecting the small-number control zone mode in which the number of the control zones is small, so as to control the heating units of the respective control zones, when a temperature is increased or decreased; and selecting the large-number control zone mode in which the number of the control zones is large, so as to control the heating units of the respective control zones, when a temperature is stabilized.

In the method of controlling a thermal processing apparatus, in the large-number control zone mode, each of the control zones is formed of the one unit area, and the control unit is configured to control, based on a signal from the in-furnace temperature sensor of the one unit area, the heating unit of the unit area; and in the small-number control zone mode, at least the one control zone is formed of the plurality of adjacent unit areas, and the control unit is configured to control, based on a signal from the in-furnace temperature sensor of the desired unit area out of the plurality of the unit areas, the heating units of the plurality of unit areas.

In the method of controlling a thermal processing apparatus, the control unit is configured to control, in the large-number control zone mode, the heating unit in each of the control zones based on a previously incorporated numerical model for large-number control zones, and is configured to control, in the small-number control zone mode, the heating unit in each of the control zones based on a previously incorporated numerical model for small-number control zones.

In the method of controlling a thermal processing apparatus, a blower is connected to the furnace body through a cooling-medium supply line, the blower being configured to supply a cooling medium to the space between the furnace body and the processing vessel, and the furnace body is provided with an exhaust pipe; and the control unit is configured to control, based on a signal from the in-furnace temperature sensor of each of the unit areas, the heating unit of the unit area and the blower.

In the method of controlling a thermal processing apparatus, the control unit is configured to select the small-number control zone mode so as to control the heating unit of each of the control zones and the blower, when a temperature is increased or decreased.

A method of controlling a thermal processing apparatus in another embodiment is a method of controlling a thermal processing apparatus comprising: a furnace body; a processing vessel disposed in the furnace body, the processing vessel defining, between the furnace body and the processing vessel, a space including therein a plurality of unit areas, and the processing vessel being configured to accommodate a plurality of objects to be processed; a heating unit disposed on an inner surface of the furnace body, correspondingly to each of the unit areas of the space; an in-processing-vessel temperature sensor disposed correspondingly to each of the unit areas in the processing vessel; and a control unit configured to control, based on a signal from the in-processing-vessel temperature sensor of each of the unit areas, the heating unit of the unit area; wherein the control unit includes a large-number control zone mode in which the number of control zones, which are formed of the unit areas and are independently controlled, is large, and a small-number control zone mode in which the number of control zones, which are formed of the unit areas and are independently controlled, is small; the method of controlling the thermal processing apparatus comprising: selecting the small-number control zone mode in which the number of the control zones is small, so as to control the heating units of the respective control zones, when a temperature is increased or decreased; and selecting the large-number control zone mode in which the number of the control zones is large, so as to control the heating units of the respective control zones, when a temperature is stabilized.

In the method of controlling a thermal processing apparatus, in the large-number control zone mode, each of the control zones is formed of the one unit area, and the control unit is configured to control, based on a signal from the in-processing-vessel temperature sensor of the one unit area, the heating unit of the unit area; and in the small-number control zone mode, at least the one control zone is formed of the plurality of adjacent unit areas, and the control unit is configured to control, based on a signal from the in-processing-vessel temperature sensor of the desired unit area out of the plurality of the unit areas, the heating units of the plurality of unit areas.

In the method of controlling a thermal processing apparatus, the control unit is configured to control, in the large-number control zone mode, the heating unit in each of the control zones based on a previously incorporated numerical model for large-number control zones, and is configured to control, in the small-number control zone mode, the heating unit in each of the control zones based on a previously incorporated numerical model for small-number control zones.

In the method of controlling a thermal processing apparatus, a blower is connected to the furnace body through a cooling-medium supply line, the blower being configured to supply a cooling medium to the space between the furnace body and the processing vessel, and the furnace body is provided with an exhaust pipe; and the control unit is configured to control, based on a signal from the in-processing-vessel temperature sensor of each of the unit areas, the heating unit of the unit area and the blower.

In the method of controlling a thermal processing apparatus, the control unit is configured to select the small-number control zone mode so as to control the heating unit of each of the control zones and the blower, when a temperature is increased or decreased.

According to the present invention, since the small-number control zone mode in which the number of the control zones is small, is selected so as to control the heaters of the respective control zones, when the temperature is increased or decreased, the control of a temperature in the furnace body can be facilitated. In addition, since the large-number control zone mode in which the number of the control zones is large, is selected so as to control the heaters of the respective control zones, a uniformity in temperature in the furnace body can be improved.

DETAILED DESCRIPTION OF THE INVENTION

Embodiment of the Invention

An embodiment of the present invention will be described herebelow with reference to the drawings.

Figure 1:
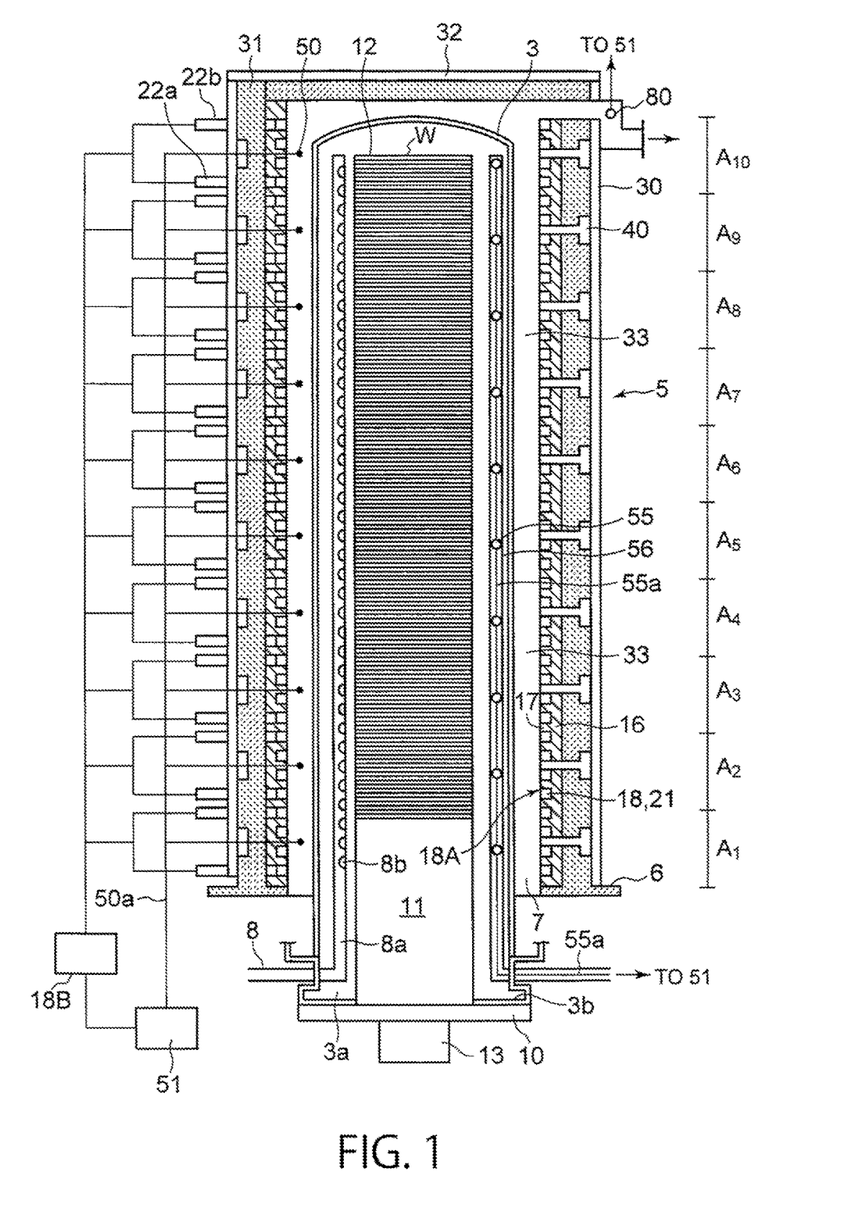
FIG. 1 is a longitudinal sectional view schematically showing an embodiment of a thermal processing apparatus and a method of controlling the same of the present invention.

In FIG. 1, a vertical-type thermal processing apparatus 1 includes a vertical-type thermal processing furnace 2 capable of simultaneously accommodating a number of objects to be processed, e.g., semiconductor wafers w, and of subjecting the semiconductor wafers w to various thermal processes such as an oxidation process, a diffusion process, a low-pressure CVD process and so on. The thermal processing furnace 2 includes a furnace body 5 and a processing vessel 3 disposed in the furnace body 5 so as to define a space 33 between the processing vessel 3 and the furnace body 5. A plurality of heating resistors (heaters) 18A serving as a heating unit are disposed on an inner circumferential surface of the thermal processing furnace 2. The processing vessel 3 is configured to accommodate and thermally process wafers w.

The space 33 between the furnace body 5 and the processing vessel 3 is divided into a plurality of unit areas (also referred to simply as "area"), e.g., ten unit areas A1, A2, A3, A4, A5, A6, A7, A8, A9 and A10, along a longitudinal direction. Each heater 18A is disposed correspondingly to one of the ten unit areas A1 . . . A10. In addition, as described below, a plurality of in-furnace temperature sensors 50 for measuring temperatures of the respective unit areas A1 . . . A10 are disposed in the unit areas A1 . . . A10, respectively. The respective in-furnace temperature sensors 50 are connected to a control unit 51, which is described below, through a signal line 50a.

Similarly, an inside of the processing vessel 3 is divided into a plurality of unit areas (also referred to simply as "area"), e.g., ten unit areas A1, A2, A3, A4, A5, A6, A7, A8, A9 and A10 in accordance with the unit areas of the space 33 along the longitudinal direction. In-processing-vessel temperature sensors 55 for measuring temperatures of the respective unit areas A1 . . . A10 are disposed correspondingly to the respective unit areas A1 . . . A10. The respective in-processing-vessel temperature sensors 55 are supported by in-processing-vessel temperature sensor supporters 56, and are connected to the control unit 51 through a signal line 55a.

The furnace body 5 is supported by a base plate 6. The base plate 6 has an opening 7 through which the processing vessel 3 is inserted upward from below. A not-shown heat insulation member is disposed on the opening 7 of the base plate 6, such that a gap between the base plate 6 and the processing vessel 3 is covered.

The processing vessel 3 is made of quartz, and has an elongated cylindrical shape with a closed upper end and an opened lower end serving as a furnace opening 3a. An outward flange 3b is formed on the lower end of the processing vessel 3. The flange 3b is supported by the base plate 6 through a not-shown flange presser. In addition, the processing vessel 3 is provided with, on a lower side thereof, an inlet port (inlet opening) 8 through which a process gas and an inert gas are introduced into the processing vessel 3, and a not-shown exhaust port (exhaust opening) through which a gas in the processing vessel 3 is discharged. A gas supply source (not shown) is connected to the inlet port 8.

Connected to the exhaust port is an exhaust system (not shown) including a vacuum pump that can control and decompress a pressure to about 133×600 Pa to 133×10-2 Pa, for example. A gas supply pipe 8*a* extending into the processing vessel 3 is connected to the inlet port 8. Gas supply holes 8*b* are formed in the gas supply pipe 8*a*.

A lid member 10 for closing the furnace opening 3*a* of the processing vessel 3 is disposed below the processing vessel 3, such that the lid member 10 can be elevated and lowered by a not-shown elevating mechanism. A heat retention tube 11, which is a heat retention means of the furnace opening, is placed on an upper part of the lid member 10. On an upper part of the heat retention tube 11, there is placed a quartz boat 12 which is a holder for holding a number of 300-mm diameter wafers w, e.g., about one hundred to one hundred and fifty wafers w, with predetermined intervals therebetween in the up and down direction. The lid member 10 is equipped with a rotation mechanism 13 configured to rotate the boat 12 about its center axis. The boat 12 is unloaded from the inside of the processing vessel 3 into a below loading area (not shown) by a downward movement of the lid member 10. After wafers w have been replaced, the boat 12 is loaded into the processing vessel 3 by an upward movement of the lid member 10.

The furnace body 5 includes a cylindrical heat insulation member 16, and a plurality of groove-shaped shelf parts 17 which are formed in an inner circumferential surface of the heat insulation member 16 in an axial direction thereof (in the up and down direction in the illustrated example) at multiple stages. Heater elements (heating wires, heating resistors) 18, which constitute the heaters 18A disposed on the respective unit areas A1 ... A10, are positioned along the respective shelf parts 17. The heat insulation member 16 is formed of inorganic fibers including silica, alumina or alumina silicate, for example.

A plurality of annular groove parts 21, which are coaxial with the heat insulation member 16, are formed in the inner circumferential surface of the cylindrical heat insulation member 16 in the axial direction with predetermined pitches at multiple stages. The circumferentially continuous annular shelf parts 17 are formed between each upper groove part 21 and each lower groove part 21 adjacent thereto. Gaps, which are sufficient for allowing a thermal expansion and contract of each heater element 18 and a radial movement thereof, are defined in an upper part and a lower part of the heater element 18 in the groove part 21, and in a space between a rear wall of the groove part 21 and the heater element 18. Due to these gaps, a cooling medium flowing from a cooling-medium introduction unit 40 of the furnace body 5 into the space 33 can go around a rear side of each heater element 18, so that the heater element 18 can be effectively cooled upon a forcible cooling operation. Air and nitrogen gas may be supposed as such a cooling medium. The cooling medium is sent to the cooling-medium introduction unit 40 by a cooling-medium supply blower (not shown) driven by an inverter output unit 53*a* which is described below.

In the heater 18A disposed on each of the unit areas A1 ... A10, terminal plates 22*a* and 22*b* are joined to the heater elements 18 constituting the heater 18A. Each of the heaters 18A is connected to an outside heater output unit 18B through the terminal plates 22*a* and 22*b* which are disposed to radially pass through the heat insulation member 16.

In order to hold the shape of the heat insulation member 16 of the furnace body 5 and to reinforce the heat insulation member 16, as shown in FIG. 1, an outer circumferential surface of the heat insulation member 16 is covered with an outer shell 30 made of metal, e.g., stainless. An upper heat insulation member 31 is disposed on a top part of the heat insulation member 16 so as to cover the same. A stainless top plate 32 covering a top part (upper end part) of the outer shell 30 is disposed on an upper part of the upper heat insulation member 31.

In the above example, a strip-like heating resistor is used as the heater element 18 and the heater element 18 is accommodated in the shelf part 17. However, not limited to this structure, a heater element of another structure may be used as the heater element 18.

As described above, the space 33 defined between the furnace body 5 and the processing vessel 3 is divided into the ten unit areas A1 ... A10. The temperature sensors (in-furnace temperature sensors) 50 for detecting temperatures of the respective unit areas A1 ... A10 are located on the unit areas A1 ... A10, respectively. Detection signals from the respective temperature sensors 50 are transmitted to the below-described control unit 51 through the signal line 50*a*.

The temperature sensors 50 located on the respective unit areas A1 ... A10 are connected to the control unit 51. The control unit 51 is described in detail below.

As described above, the temperature sensors 50 are located on the respective unit areas A1 ... A10 of the space 33 so as to detect temperatures of the respective unit areas A1 ... A10.

Figure 2:
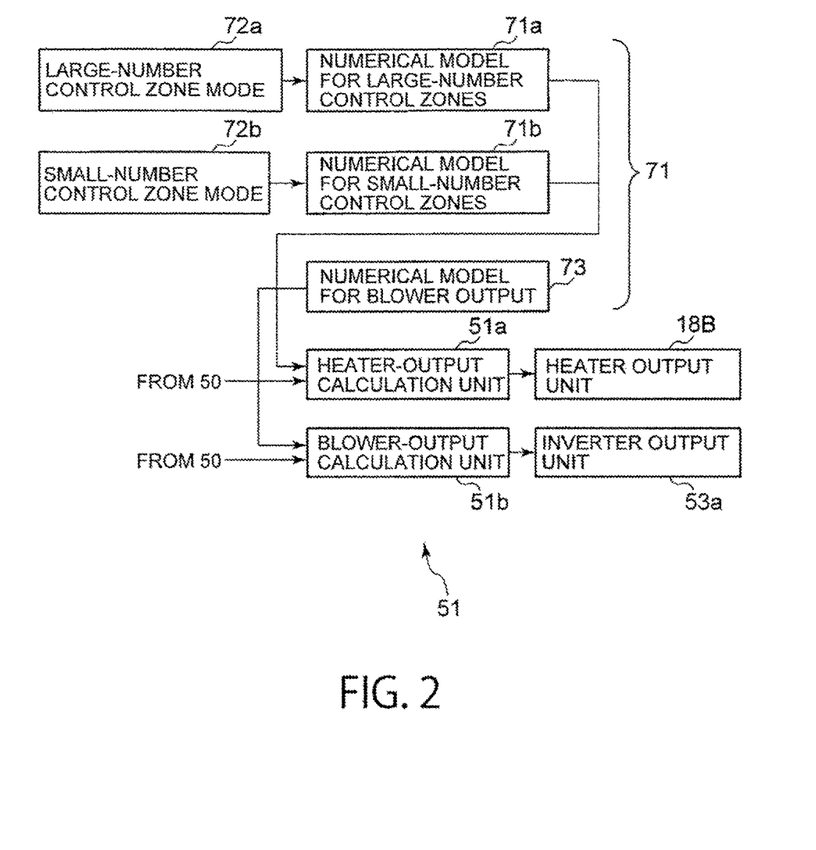
FIG. 2 is a schematic view showing a control unit of the thermal processing apparatus.

Detection signals detected by the temperature sensors 50 of the respective unit areas A1 ... A10 are transmitted to the control unit 51 through the signal line 50*a*. The control unit 51 is configured to reduce a time period required for an actual temperature to be converged to a predetermined target temperature, and to precisely make the temperature close to the target temperature, in a temperature increase process and a temperature decrease process of a lower temperature range such as 100° C. to 500° C., and in a temperature stabilized period (FIG. 2).

Figure 3:
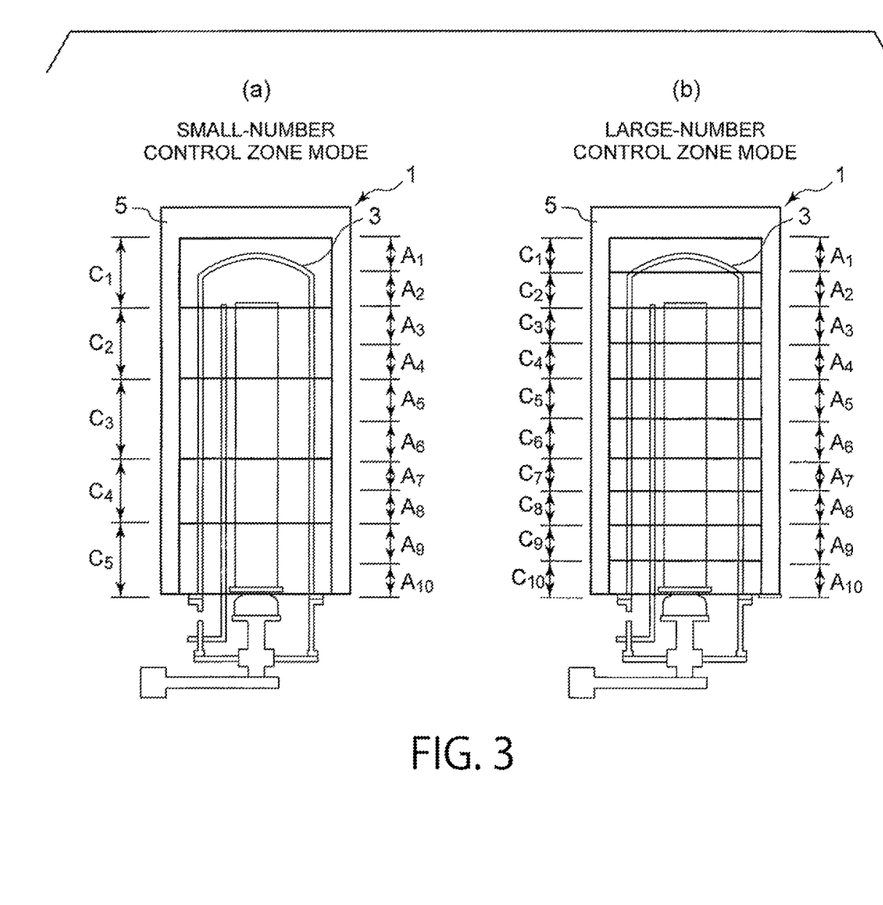
FIG. 3(a) is a view showing a small-number control zone model control.
FIG. 3(b) is a view showing a large-number control zone model control.

Namely, as shown in FIGS. 3(*a*) and 3(*b*), the control unit 51 has a large-number control zone mode 72*a* in which the number of the control zones C1, C2, C3, C4, C5, C6, C7, C8, C9 and C10, which are independently controlled, is large, and a small-number control zone mode 72*b* in which the number of control zones C1, C2, C3, C4 and C5, which are independently controlled, is small. The control unit 51 can select any one of the large-number control zone mode 72*a* and the small-number control zone mode 72*b*.

When the control unit 51 selects the large-number control zone mode 72*a*, the control zones C1 ... C10 to be independently controlled respectively correspond to the ten unit areas A1 ... A10 constituting the space 33 between the furnace body 5 and the processing vessel 3. The control unit 51 independently controls the control zones C1 ... C10 corresponding to the unit areas A1 ... A10, respectively.

When the control unit 51 selects the small-number control zone mode 72*b*, the control zone C1 to be independently controlled corresponds to the adjacent unit areas A1 and A2, the control zone C2 corresponds to the adjacent unit areas A3 and A4, the control zone C3 corresponds to the adjacent unit areas A5 and A6, the control zone C4 corresponds to the adjacent unit areas A7 and A8, and the control zone C5 corresponds to the adjacent unit areas A9 and A10. The control unit 51 controls the control zones C1 to C5 independently. When the small-number control zone mode 72*b* is selected, a least one control zone may be composed of a plurality of unit areas adjacent to each other, and other control zones may be composed of the respective unit areas.

To be specific, when the control unit 51 selects the large-number control zone mode 72a, based on signals from all the temperature sensors 50 of the respective unit areas A1 . . . A10, the control unit 51 controls the heaters 18A of the corresponding unit areas A1 . . . A10, independently. In this case, the control unit 51 may control the heaters 18A of the respective unit areas A1 . . . A10, in consideration of a signal from an exhaust-air temperature sensor 80 disposed on an outlet side of the space 33.

When the control unit 51 selects the small-number control zone mode 72b, the control unit 51 controls the heaters 18A, based on signals from the temperature sensors of every other unit area A1, A3, A5, A7 and A9, for example. Specifically, the control unit 51 collectively controls the heaters 18A of the unit areas A1 and A2, based on a signal from the temperature sensor 50 of the unit area A1. The control unit 51 collectively controls the heaters 18A of the unit areas A3 and A4, based on a signal from the temperature sensor 50 of the unit area A3. The control unit 51 collectively controls the heaters 18A of the unit areas A5 and A6, based on a signal from the temperature sensor 50 of the unit area A5. The control unit 51 collectively controls the heaters 18A of the unit areas A7 and A8, based on a signal from the temperature sensor 50 of the unit area A7. The control unit 51 collectively controls the heaters 18A of the unit areas A9 and A10, based on a signal from the temperature sensor 50 of the unit area A9. In this case, the control unit 51 may control the heaters 18A of the respective unit areas A1 . . . A10, in consideration of a signal from the temperature sensor 80.

In addition, the control unit 51 includes: a predetermined numerical model 71 which relates to a heater output and a blower output; a heater-output calculation unit 51a which calculates a heater output based on the numerical model 71 and an in-furnace temperature from the temperature sensor 50; and a blower-output calculation unit 51b which calculates a blower output based on the numerical model 71 and an in-furnace temperature from the temperature sensor 50.

The numerical model 71 includes: a numerical model 71a for large-number control zones, which is used when the large-number control zone mode 72a is selected; a numerical model 71b for small-number control zones, which is used when the small-number control zone mode 72b is selected; and a numerical model 73 for blower output.

The heater-output calculation unit 51a calculates outputs of the heaters 18A of the respective unit areas A1 . . . A10, based on either one of the numerical model 71a for large-number control zones and the numerical model 71b for small-number control zones, and signals from the temperature sensors 50 of the respective unit areas A1 . . . A10. Then, the heaters 18A of the unit areas A1 . . . A10 are controlled by the heater output unit 18B, based on the outputs of the heaters 18A calculated by the heater-output calculation unit 51a. For example, when the control unit 51 selects the large-number control zone mode 72a, outputs of the heaters 18A of all the unit areas A1 . . . A10 are calculated by the heater-output calculation unit 51a, based on the numerical model 71a for large-number control zones and signals from the temperature sensors 50 of all the unit areas A1 . . . A10. Based on the outputs of the heaters 18A, the heater output unit 18B drives and controls the heaters 18A of all the unit areas A1 . . . A10, independently.

The blower-output calculation unit 51b calculates a blower output, based on the numerical model 73 for blower output and a signal from the temperature sensor 50 of one of the unit areas A1 . . . A10. Based on the blower output, an inverter output unit 53a is controlled.

Among the models of the numerical model 71, the numerical model 71a for large-number control zones for controlling the heaters is described.

The numerical model 71a for large-number control zones is a mathematical model which can previously estimate temperatures of semiconductor wafers w from the temperature sensors 50 and the heater output unit 18B, and then specify a power to be supplied to the heater 18 in order that the estimated temperatures are made close to a target temperature as a whole. A given model (multi-variables, multi-dimensions, multi-output functions) can be utilized as the numerical model 71a for large-number control zones. As such a numerical model 71a for large number control zones, a model disclosed in U.S. Pat. No. 5,517,594 B can be used, for example.

In this manner, there can be obtained the numerical model 71a for large-number control zones that can estimate a temperature of a wafer, and define an output for allowing the wafer temperature to be a target temperature, depending on the number of wafers to be processed and an arrangement thereof. In the above example, although an estimated wafer temperature is to be controlled, the model may control an observed temperature itself. The numerical model 71b for small-number control zones can be obtained in the same manner as the numerical model 71a for large-number control zones. In this case, the numerical model 71a for large-number control zones has a relationship between a time and a temperature respectively set for each control zone, when the large-number control zone mode 72a is selected. The numerical model 71b for small-number control zones has a relationship between a time and a temperature respectively set for each control zone, when the small-number control zone mode 72b is selected.

Similarly to the manner for obtaining the numerical model 71a for large-number control zones and the numerical model 71b for small-number control zones, the numerical model 73 for blower output can be obtained, by actually measuring a temperature of a semiconductor wafer w, while actually operating a cooling-medium supply blower and operating the heater 18A.

In the above example, although the numerical model 71 includes in a separate manner the numerical model 71a for large-number control zones, the numerical model 71b for small-number control zones and the numerical model 73 for blower output, the single numerical model 71 may include in a combined manner a numerical model for large-number control zones, a numerical model for small-number control zones and a numerical model for blower output.

The heater outputs calculated by the heater-output calculation unit 51a are transmitted to the heater output unit 18B. The heater elements 18 of the heaters 18A in the respective unit areas A1 . . . A10 are driven and controlled by the heater output unit 18B, based on the heater outputs calculated by the heater-output calculation unit 51a.

On the other hand, the blower output calculated by the blower-output calculation unit 51b is transmitted to the inverter output unit 53a, and the cooling-medium supply blower is driven and controlled by the inverter output unit 53a.

In this manner, a cooling medium is supplied by the cooling-medium supply blower into the space 33 between the furnace body 5 and the processing vessel 3.

Next, an operation of the thermal processing apparatus as structured above is described.

At first, wafers w are placed in the boat 12, and the boat 12 with the wafers w is put on the heat insulation tube 11 of the lid member 10. Then, the boat 12 is loaded into the processing vessel 3 by the upward movement of the lid member 10.

Then, the control unit 51 controls the heater output unit 18B so as to control outputs of the heaters 18A in the respective unit areas A1 . . . A10. Thus, the space 33 between the furnace body 5 and the processing vessel 3 is heated, whereby the wafers w on the boat 12 in the processing vessel 3 are subjected to a required thermal process.

To be specific, when a temperature is increased or decreased, the control unit 51 selects the small-number control zone mode 72b in which the number of the control zones is small. In this case, the inside of the space 33 between the furnace body 5 and the processing vessel 3 is divided into the five control zones, C1 . . . C5, for example. The control zone C1 corresponds to the unit areas A1 and A2, the control zone C2 corresponds to the unit areas A3 and A4, the control zone C3 corresponds to the unit areas A5 and A6, the control zone C4 corresponds to the unit areas A7 and A8, and the control zone C5 corresponds to the unit areas A9 and A10 (FIG. 3(*a*)).

At this time, the control unit 51 uses the numerical model 71b for small-number control zones. Based on the numerical model for small-number control zones and signals from the temperature sensors 50 of every other unit areas A1, A3, A5, A7 and A9, the heater-output calculation unit 51a calculates outputs of the heaters 18A of the corresponding unit areas A1 and A2 (control zone C1), outputs of the heaters 18A of the corresponding unit areas A3 and A4 (control zone C2), outputs of the heaters 18A of the corresponding unit areas A5 and A6 (control zone C3), outputs of the heaters 18A of the corresponding unit areas A7 and A8 (control zone C4), and outputs of the heaters 18A of the corresponding unit areas A9 and A10 (control zone C5).

Then, based on the heater outputs calculated by the heater-output calculation unit 51a, the heater output unit 18B collectively controls the heaters 18A of the unit areas A1 and A2 (control zone C1), collectively controls the heaters 18A of the unit areas A3 and A4 (control zone C2), collectively controls the heaters 18A of the unit areas A5 and A6 (control zone C3), collectively controls the heaters 18A of the unit areas A7 and A8 (control zone C4), and collectively controls the heaters 18A of the unit areas A9 and A10 (control zone C5).

When the temperature is stabilized, the control unit 51 selects the large-number control zone mode 72a in which the number of the control zones is large. In this case, the control zones C1, C2, C3, C4 . . . C10 respectively correspond to the unit areas A1, A2, A3, A4 . . . A10 (FIG. 3(*b*)).

At this time, the control unit 51 uses the numerical model 71a for large-number control zones. Based on the numerical model 71a for large-number control zones and signals from the temperature sensors 50 of the respective unit areas A1 . . . A10, the heater-output calculation unit 51a calculates outputs of the heaters 18A of the respective unit areas A1 . . . A10.

Then, the heater output unit 18B drives and controls the heaters 18A of the respective unit areas A1 . . . A10, independently, based on the heater outputs calculated by the heater output calculation unit 51a.

Figure 4:
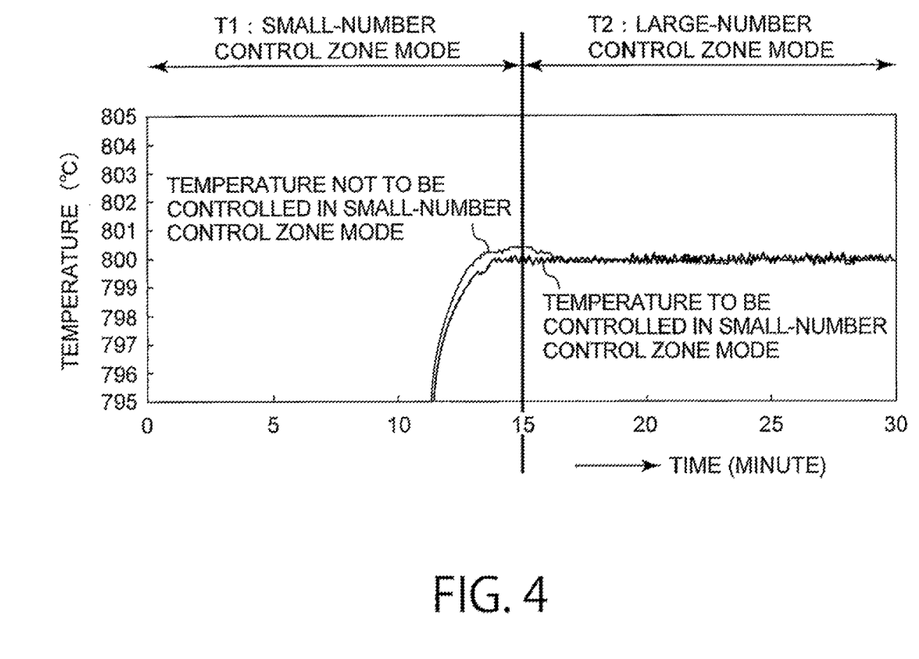
FIG. 4 is a view showing a temperature change in a furnace body over time.
Figure 5:
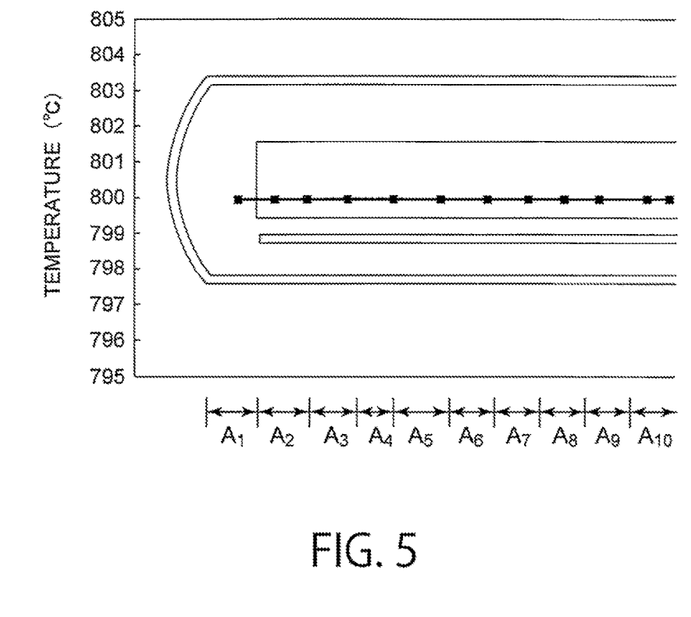
FIG. 5 is a schematic view showing temperatures in respective unit areas of the furnace body.

As shown in FIG. 4, since the control unit 51 selects, in a temperature increase/decrease time T1, the small-number control zone mode 71b, and selects in a temperature stabilized time T2, the large-number control zone mode 71a, so as to control the heaters 18A of the unit areas A1 . . . A10, the number of the control zones is made smaller in the temperature increase/decrease time T1 whereby the control parameters can be easily tuned. In addition, as shown in FIG. 5, in the temperature stabilized time T2, the unit areas A1 . . . A10 can be finely, uniformly controlled. In the small-number control zone mode during the time T1, detection temperatures from the temperature sensors 50, which are to be controlled, sufficiently follow the set temperature, but temperatures of the temperature sensors (illustrated as temperatures which are not to be controlled), which are not to be controlled, somewhat deviate from the set temperature. In the subsequent large-number control zone mode during the time T2, detection temperatures from all the temperature sensors 50 can be controlled within a range of ±1° C. relative to the set temperature.

As described below, during this time, the inside of the space 33 between the furnace body 5 and the processing vessel 3 is forcibly cooled, in order to make effective a thermal processing operation according to need.

In this case, the cooling-medium supply blower is activated by the control unit 51. At this time, a cooling medium (20 to 30° C.) is blown out from the cooling-medium introduction unit 40 into the space 33 between the furnace body 5 and the processing vessel 3, so that the inside of the space 33 is forcibly cooled.

In this case, the blower-output calculation unit 51b determines a blower output, based on the numerical model 73 for blower output and an in-furnace temperature from the temperature sensor 50 located on any of the unit areas A1 . . . A10. Based on the blower output, the inverter output unit 53a drives and controls the cooling-medium supply blower.

Alternative Example of Thermal Processing Apparatus of the Present Invention

Next, an alternative example of the thermal processing apparatus of the present invention is described.

In the above embodiment, the thermal processing apparatus is controlled by the control unit 51, based on signals from the in-furnace temperature sensors 50 located in the respective unit areas $A_1$ . . . $A_{10}$ of the space 33 defined between the furnace body 5 and the processing vessel 3. However, not limited thereto, the thermal processing apparatus may be controlled by a control unit 51, based on signals from the in-processing-vessel temperature sensors 55 located in the respective unit areas $A_1$ . . . $A_{10}$ in the processing vessel 3.

Namely, as described above, the inside of the processing vessel 3 is divided into the ten unit areas $A_1$ . . . $A_{10}$ in accordance with the ten unit areas $A_1$ . . . $A_{10}$. The in-processing-vessel temperature sensors 55 for detecting temperatures of the unit areas $A_1$ . . . $A_{10}$ are located in the respective unit areas $A_1$ . . . $A_{10}$. Detection signals from the in-processing-vessel temperature sensors 55 are transmitted to the control unit (control device) 51 through the signal line 55a. The in-processing-vessel temperature sensors 55 located in the respective unit areas $A_1$ . . . $A_{10}$ are supported by the in-processing-vessel temperature sensor supporters 56.

Figure 6:
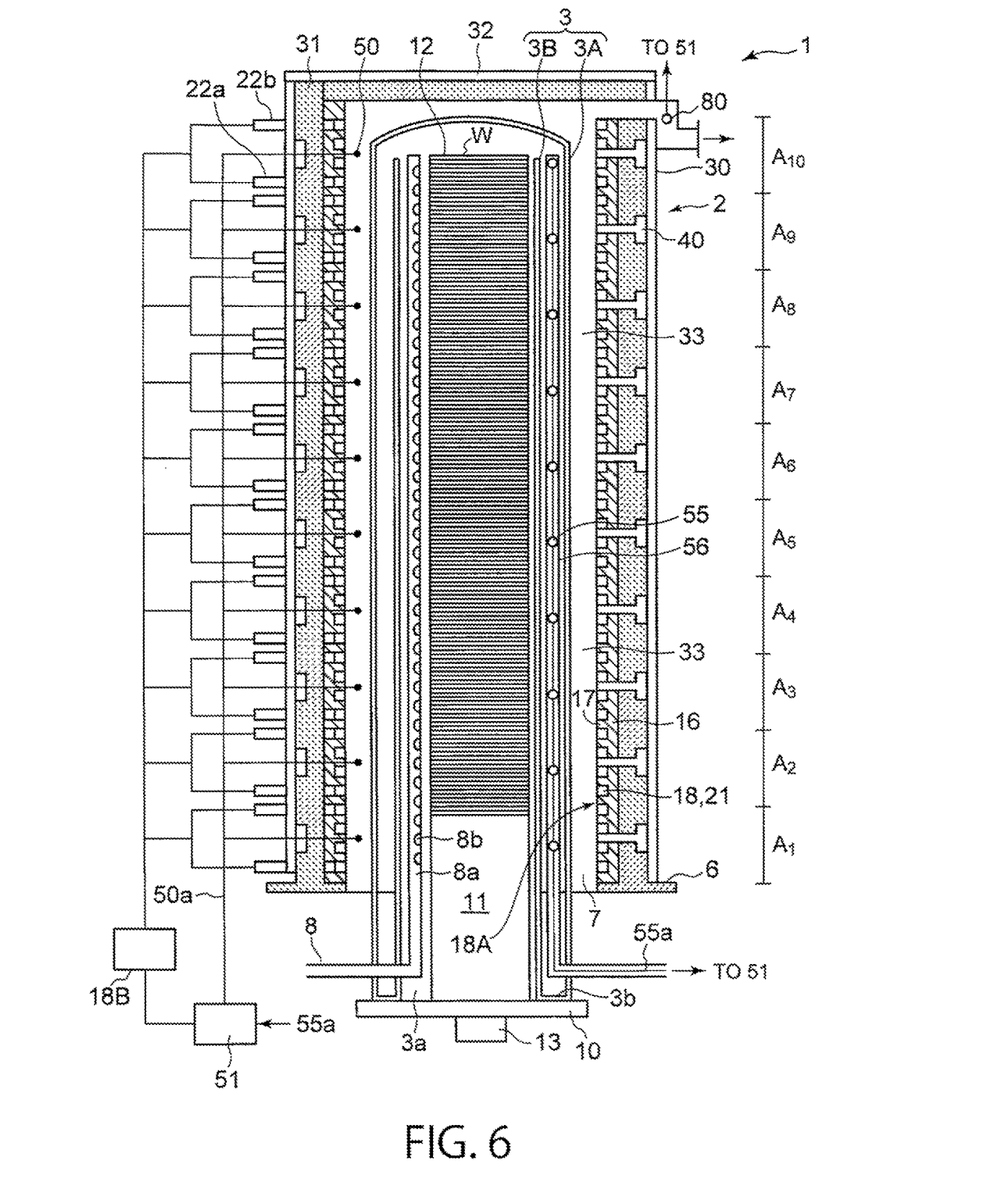
FIG. 6 is a view schematically showing an alternative example of the thermal processing apparatus of the present invention.

Next, an alternative example of the present invention is described with reference to FIG. 6. FIG. 6 is a view schematically showing an alternative example of the thermal processing apparatus of the present invention.

Structures of the thermal processing apparatus shown in FIG. 6 are substantially the same with the structures of the thermal processing apparatus shown in FIGS. 1 to 5, only excluding the structure of the processing vessel 3.

Namely, in FIG. 1, the processing vessel 3 is formed of a single tube. However, not limited thereto, the processing vessel 3 may have a dual tube structure including an outer tube 3A and an inner tube 3B positioned in the outer tube 3A.

In the thermal processing apparatus shown in FIG. 6, the same parts as the parts of the thermal processing apparatus shown in FIGS. 1 to 5 are shown by the same reference numbers, and detailed description thereof is omitted.

In the above embodiment, the space 33 between the furnace body 5 and the processing vessel 3 and the inside of the processing vessel 3 are divided into the ten unit areas A1 . . . A10. However, not limited thereto, the number of the divided unit areas may be three or more. In this case, when the number of the unit areas is larger, the effect of the present invention can be more improved.

In addition, the space 33 and the inside of the processing vessel 3 are uniformly divided. However, not limited thereto, depending on a used condition of the apparatus, a width, a position and a shape of the unit area may be varied, which makes no difference in effect of the present invention.

The invention claimed is:

1. A method of controlling a thermal processing apparatus comprising: a furnace body; a processing vessel disposed in the furnace body, the processing vessel defining a space, between the furnace body and the processing vessel, the space including therein a plurality of unit areas, wherein the processing vessel is configured to accommodate a plurality of objects to be processed therein; a plurality of heating units disposed on an inner surface of the furnace body, corresponding to each of the unit areas of the space; a plurality of in-furnace temperature sensors disposed within the furnace and corresponding to each of the unit areas of the space; and a control unit configured to control the heating units of the unit areas, based on a signal from the in-furnace temperature sensors of each of the unit areas; wherein the control unit includes a first control zone mode in which a number of control zones, which are formed of the unit areas and are independently controlled, corresponds to a total number of the unit areas, and a second control zone mode in which the number of control zones, which are formed of the unit areas and are independently controlled, is less than the total number of the unit areas; the method of controlling the thermal processing apparatus comprising:

selecting the second control zone mode to control the heating units of the respective control zones when a temperature is increased or decreased; and selecting the first control zone mode to control the heating units of the respective control zones when a temperature is stabilized.

2. The method of controlling a thermal processing apparatus according to claim 1, wherein in the first control zone mode, each of the control zones is formed of one unit area, and the control unit is configured to control, based on a signal from the in-furnace temperature sensor of each unit area, the heating unit of each unit area; and in the second control zone mode, at least one control zone is formed of the plurality of adjacent unit areas, and the control unit is configured to control, based on a signal from the in-furnace temperature sensor of the desired unit area out of the plurality of the unit areas, the heating units of the plurality of unit areas.

3. The method of controlling a thermal processing apparatus according to claim 1, wherein the control unit is configured to control, in the first control zone mode, the heating unit in each of the control zones based on a previously incorporated numerical model for first control zones, and is configured to control, in the second control zone mode, the heating unit in each of the control zones based on a previously incorporated numerical model for second control zones.

4. The method of controlling a thermal processing apparatus according to claim 1, wherein:

a blower is connected to the furnace body through a cooling-medium supply line, the blower being configured to supply a cooling medium to the space between the furnace body and the processing vessel, wherein the furnace body is provided with an exhaust pipe; and wherein the control unit is configured to control the heating unit of the unit area and the blower, based on a signal from the in-furnace temperature sensor of each of the unit areas.

5. The method of thermal processing apparatus according to claim 4, wherein the control unit is configured to select the second control zone mode to control the heating unit of each of the control zones and the blower, when a temperature is increased or decreased.

6. A method of controlling a thermal processing apparatus comprising: a furnace body; a processing vessel disposed in the furnace body, the processing vessel defining a space, between the furnace body and the processing vessel, the space including therein a plurality of unit areas, wherein the processing vessel is configured to accommodate a plurality of objects to be processed therein; a plurality of heating units disposed on an inner surface of the furnace body, corresponding to each of the unit areas of the space; a plurality of in-processing-vessel temperature sensors disposed within the furnace and corresponding to each of the unit areas in the processing vessel; and a control unit configured to control the heating units of the unit areas, based on a signal from the in-processing-vessel temperature sensors of each of the unit areas; wherein the control unit includes a first control zone mode in which a number of control zones, which are formed of the unit areas and are independently controlled, corresponds to a total number of the unit areas, and a second control zone mode in which the number of control zones, which are formed of the unit areas and are independently controlled, is less than the total number of the unit areas; the method of controlling the thermal processing apparatus comprising:

selecting the second control zone mode to control the heating units of the respective control zones, when a temperature is increased or decreased; and selecting the first control zone mode to control the heating units of the respective control zones when a temperature is stabilized.

7. The method of controlling a thermal processing apparatus according to claim 6, wherein in the first control zone mode, each of the control zones is formed of one unit area, and the control unit is configured to control, based on a signal from the in-processing-vessel temperature sensor of each unit area, the heating unit of each unit area; and in the second control zone mode, at least one control zone is formed of the plurality of adjacent unit areas, and the control unit is configured to control, based on a signal from the in-processing-vessel temperature sensor of the desired unit area out of the plurality of the unit areas, the heating units of the plurality of unit areas.

8. The method of controlling a thermal processing apparatus according to claim 6, wherein the control unit is configured to control, in the first control zone mode, the heating unit in each of the control zones based on a previously incorporated numerical model for first control zones, and is configured to control, in the second control zone mode, the heating unit in each of the control zones based on a previously incorporated numerical model for second control zones.

9. The method of controlling a thermal processing apparatus according to claim 6, wherein:
- a blower is connected to the furnace body through a cooling-medium supply line, the blower being configured to supply a cooling medium to the space between the furnace body and the processing vessel, wherein the furnace body is provided with an exhaust pipe; and
- wherein the control unit is configured to control the heating unit of the unit area and the blower, based on a signal from the in-processing-vessel temperature sensor of each of the unit areas.

10. The method of thermal processing apparatus according to claim 9, wherein the control unit is configured to select the second control zone mode to control the heating unit of each of the control zones and the blower, when a temperature is increased or decreased.

\* \* \* \* \*